United States Patent
Chung et al.

(10) Patent No.: US 8,094,111 B2
(45) Date of Patent: Jan. 10, 2012

(54) LIQUID CRYSTAL DISPLAY AND ARRAY SUBSTRATE THEREOF

(75) Inventors: Te-Chen Chung, Kun Shan (CN); Yu-wen Chiu, Kun Shan (CN); Chia-Te Liao, Kun Shan (CN); Yanbing Qiao, Kun Shan (CN)

(73) Assignee: Infovision Optoelectronics (Kunshan) Co., Ltd., Kunshan (CN)

( * ) Notice: Subject to any disclaimer, the term of this patent is extended or adjusted under 35 U.S.C. 154(b) by 532 days.

(21) Appl. No.: 12/423,019

(22) Filed: Apr. 14, 2009

(65) Prior Publication Data

US 2009/0295694 A1  Dec. 3, 2009

(30) Foreign Application Priority Data

May 30, 2008 (CN) .......................... 2008 1 0098797

(51) Int. Cl.
  *G09G 3/36* (2006.01)
(52) U.S. Cl. ........................................................ 345/90
(58) Field of Classification Search .................... 345/90, 345/87, 103; 349/55, 141; 474/202
See application file for complete search history.

(56) References Cited

U.S. PATENT DOCUMENTS

| 6,710,827 | B2 * | 3/2004 | Kubo et al. ....................... 349/55 |
| 6,922,183 | B2 * | 7/2005 | Ting et al. ........................ 345/87 |
| 2001/0028429 | A1 | 10/2001 | Wu |
| 2007/0139356 | A1 * | 6/2007 | Lee et al. ....................... 345/103 |
| 2007/0225096 | A1 * | 9/2007 | Fujita .............................. 474/202 |
| 2007/0229748 | A1 * | 10/2007 | Fujita .............................. 349/141 |

FOREIGN PATENT DOCUMENTS

CN    1740885 A    3/2006

\* cited by examiner

*Primary Examiner* — Fred Tzeng
(74) *Attorney, Agent, or Firm* — Aaron Wininger; Perkins Coie LLP

(57) ABSTRACT

The present invention provides a liquid crystal display and an array substrate thereof. The array substrate comprises scan lines, data lines and a plurality of pixel defined by a crosswise arrangement of the scan lines and the data lines. The pixel comprises a first sub-pixel electrode; a second sub-pixel electrode electrically isolated from the first sub-pixel electrode; a first switching element for controlling the first sub-pixel electrode; and a second switching element for controlling the second sub-pixel electrode. When the control of the first sub-pixel electrode by the first switching element cannot be carried out normally, the second switching element can control at least a part of the first sub-pixel electrode in place of the first switching element.

17 Claims, 11 Drawing Sheets

LIQUID CRYSTAL DISPLAY AND ARRAY SUBSTRATE THEREOF

CROSS-REFERENCE TO RELATED APPLICATION

This application claims priority of and incorporates by reference Chinese Patent Application No. 200810098797.8 filed on May 30, 2008.

FIELD OF THE INVENTION

The present invention relates to a liquid crystal display (LCD) and an array substrate thereof.

BACKGROUND

Liquid crystal displays are advantageous in being light, thin and low in power consumption, and have been widely used in modern information devices such as notebook computers, mobile phones, and personal digital assistants (PDAs). In order to achieve a wide viewing angle, a number of techniques have been developed, such as Twisted Nematic (TN) LCD with wide viewing film, In-Plane Switching (IPS) LCD, Fringe Field Switching (FFS) LCD, and Multi-domain Vertical Alignment (MVA) LCD.

An MVA LCD is provided with protrusions or slits on its color filter substrate or thin film transistor (TFT) array substrate, which can cause liquid crystal molecules to be aligned in multiple directions to obtain a plurality of different Alignment Domains. The MVA LCD is therefore advantageous in achieving a wide viewing angle.

U.S. Pat. No. 6,922,183 discloses an MVA LCD, a pixel structure of which is shown in FIG. 1. It is noted that the color filter substrate is omitted in FIG. 1 in order to show the structure more clearly. As shown in FIG. 1, in the pixel structure of this LCD, each pixel is divided into two sub-pixels, and the pixel electrode P(m, n) is also divided into two sub-pixel electrodes, that is, a first sub-pixel electrode SP1(m, n) and a second sub-pixel electrode SP2(m, n), which are electrically isolated with a slit 124. The first and second sub-pixel electrodes SP1(m, n) and SP2(m, n) are respectively controlled by two switching elements, for example a first TFT S1(m, n) and a second TFT S2(m, n). The first and second TFTs S1(m, n) and S2(m, n) each have a gate electrode electrically connected with scan lines SL(m) and SL(m+1) respectively, a source electrode electrically connected with data lines DL1(n) and DL2(n) respectively, and a drain electrode electrically connected with the first sub-pixel electrode SP1(m, n) and the second sub-pixel electrode SP2(m, n) respectively.

FIG. 2 is a section view of the pixel structure taken along a line I-I' of FIG. 1. As shown in FIG. 2, the pixel structure comprises a first substrate 102, a second substrate 122 and a plurality of liquid crystal molecules 126. A black matrix 104 and a color filter layer 106 are formed on a surface of the first substrate 102, and a first insulating layer 108 covers the black matrix 104 and the color filter layer 106. A common electrode 110 is formed on the first insulating layer 108, and is provided with a plurality of protrusions 131. An alignment film 112 covers the common electrode 110 and the protrusions 131.

In addition, the scan lines SL(m) and SL(m+1) are formed on a surface of the second substrate 122 opposite to the common electrode 110, and are covered by a gate insulating layer 120. The data line DL(n) which is not shown in FIG. 2 is formed on the gate insulating layer 120, and is covered by a passivation layer 118. The first sub-pixel electrode SP1(m, n) and the second sub-pixel electrode SP2(m, n) are formed on the passivation layer 118. A plurality of clearances 130 are formed respectively above the scan lines SL(m) and SL(m+1) to separate the pixel electrodes of two adjacent pixels. A slit 124 is provided between the first sub-pixel electrode SP1(m, n) and the second sub-pixel electrode SP2(m, n) to electrically isolate the two sub-pixel electrodes. An alignment film 116 covers the first and second sub-pixel electrodes SP1(m, n) and SP2(m, n). The liquid crystal molecules 126 are sealed between the first substrate 102 and the second substrate 122.

Data signals of opposite polarities are inputted to the first and second sub-pixel electrodes SP1(m, n) and SP2(m, n) through the first and second TFTs S1(m, n) and S2(m, n) respectively to drive the whole pixel. The voltage applied on the common electrode 110 serves as a common voltage Vcom. A voltage higher than the common voltage Vcom is defined as a voltage of positive polarity, and a voltage lower than the common voltage Vcom is defined as a voltage of negative polarity. When the pixel is selected and the first and second TFTs S1(m, n) and S2(m, n) are conducted, a data signal with a voltage of positive polarity +V and a data signal with a voltage of negative polarity -V are respectively inputted to the first sub-pixel electrode SP1(m, n) and the second sub-pixel electrode SP2(m, n). In addition, the difference between the voltage of positive polarity +V and the common voltage Vcom is substantially equal to that between the common voltage Vcom and the voltage of negative polarity -V such that the same gray level is displayed in the two sub-pixels.

When voltages with different polarities are applied on the first and second sub-pixel electrodes SP1(m, n) and SP2(m, n), due to the clearance 130, the slit 124 and the protrusions 131, the liquid crystal molecule 126 forms two display domains with opposite visual properties, and thus an MVA LCD with a wide viewing angle is achieved.

In manufacturing an LCD, dot defects often occur due to failure of a TFT, shorting or the like. The pixel described above consists of two sub-pixels. When a dot defect occurs in one sub-pixel due to failure of a TFT, shorting or the like, the other sub-pixel can still operate normally, and thus the whole pixel does not thoroughly fail. In other words, the dot defect may be "partially repaired" to some extent. In this case, however, normal display cannot be achieved in the whole pixel, so such a "repair" cannot make a complete repair to the dot defect. A similar disadvantage also exists in other LCDs in which a pixel consists of multiple sub-pixels in addition to MVA LCD described above.

SUMMARY

An embodiment of the invention provides an array substrate of liquid crystal display comprising a plurality of scan lines, a plurality of data lines and a plurality of pixels defined by a crosswise arrangement of the scan lines and the data lines, the pixel comprising: a first sub-pixel electrode; a second sub-pixel electrode electrically isolated from the first sub-pixel electrode; a first switching element for controlling the first sub-pixel electrode; and a second switching element for controlling the second sub-pixel electrode, wherein when the control of the first sub-pixel electrode by the first switching element cannot be carried out normally, the second switching element can control at least a part of the first sub-pixel electrode in place of the first switching element.

An embodiment of the invention further provides a liquid crystal display comprising the array substrate.

According to the embodiments of the invention, a dot defect in a pixel can be fully repaired, and therefore a yield of liquid crystal display and array substrate can be greatly improved without any substantial increase in manufacturing costs.

BRIEF DESCRIPTION OF THE DRAWINGS

From the following detailed description to the embodiments, accompanying with the drawings, the present invention will be more apparent. In the drawings.

DETAILED DESCRIPTION OF EMBODIMENTS

Illustrative embodiments of the invention will be described in the following with reference to the accompany drawings in which the same reference numbers are used to indicate the same components.

Figure 1:
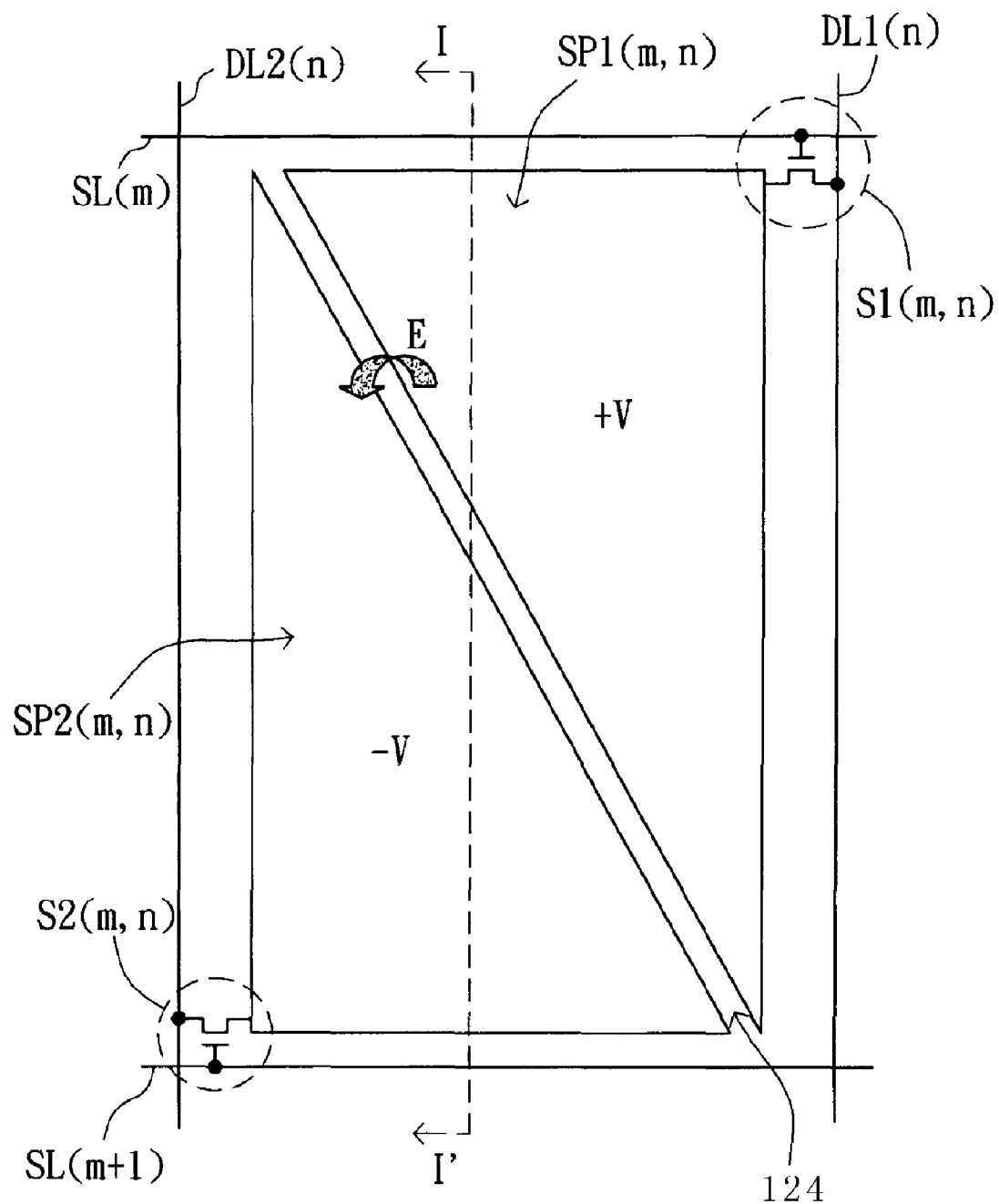
FIG. 1 shows a pixel structure of a conventional MVA LCD.
Figure 2:
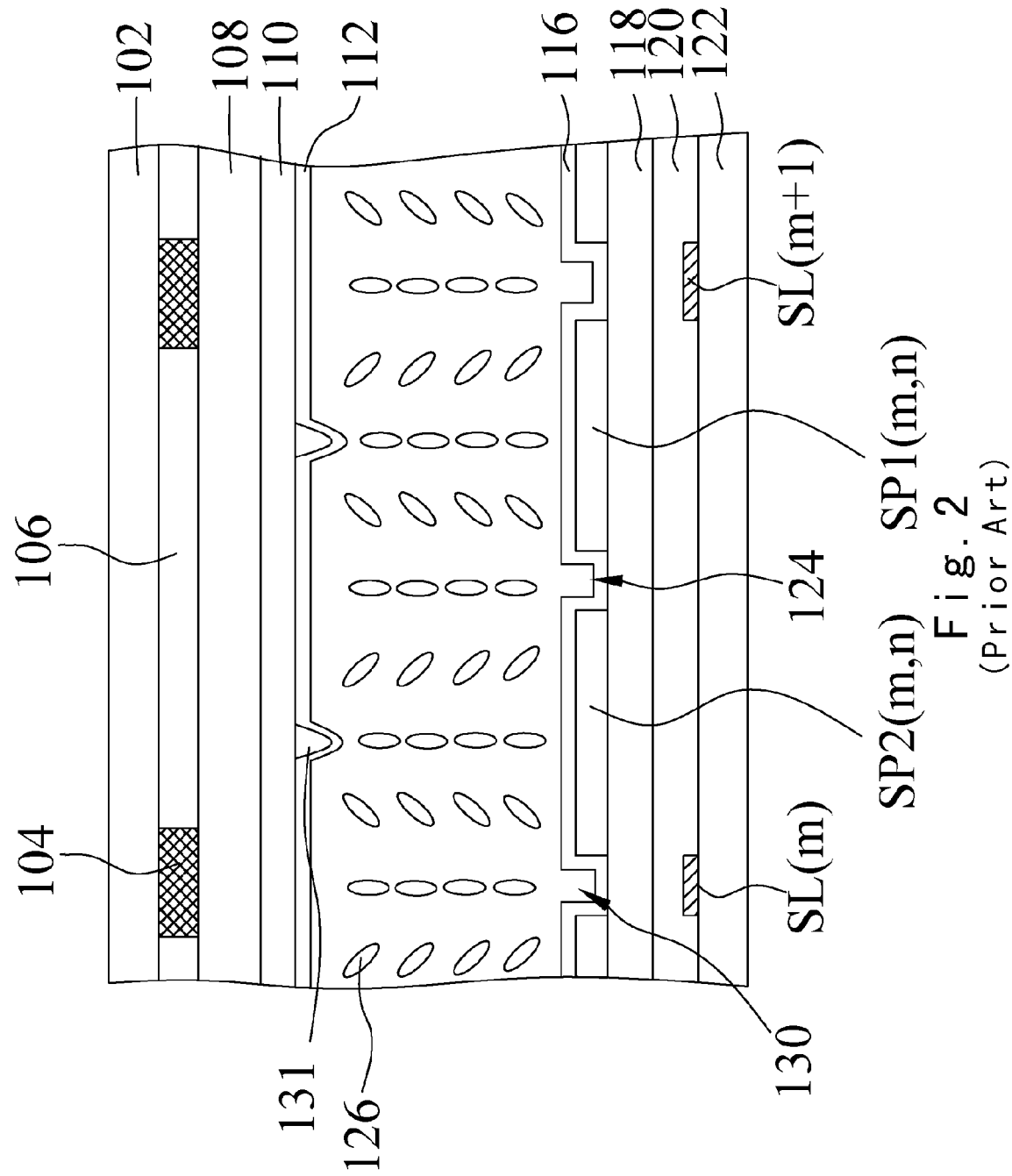
FIG. 2 is a section view showing the pixel structure taken along a line I-I' in FIG. 1.
Figure 3:
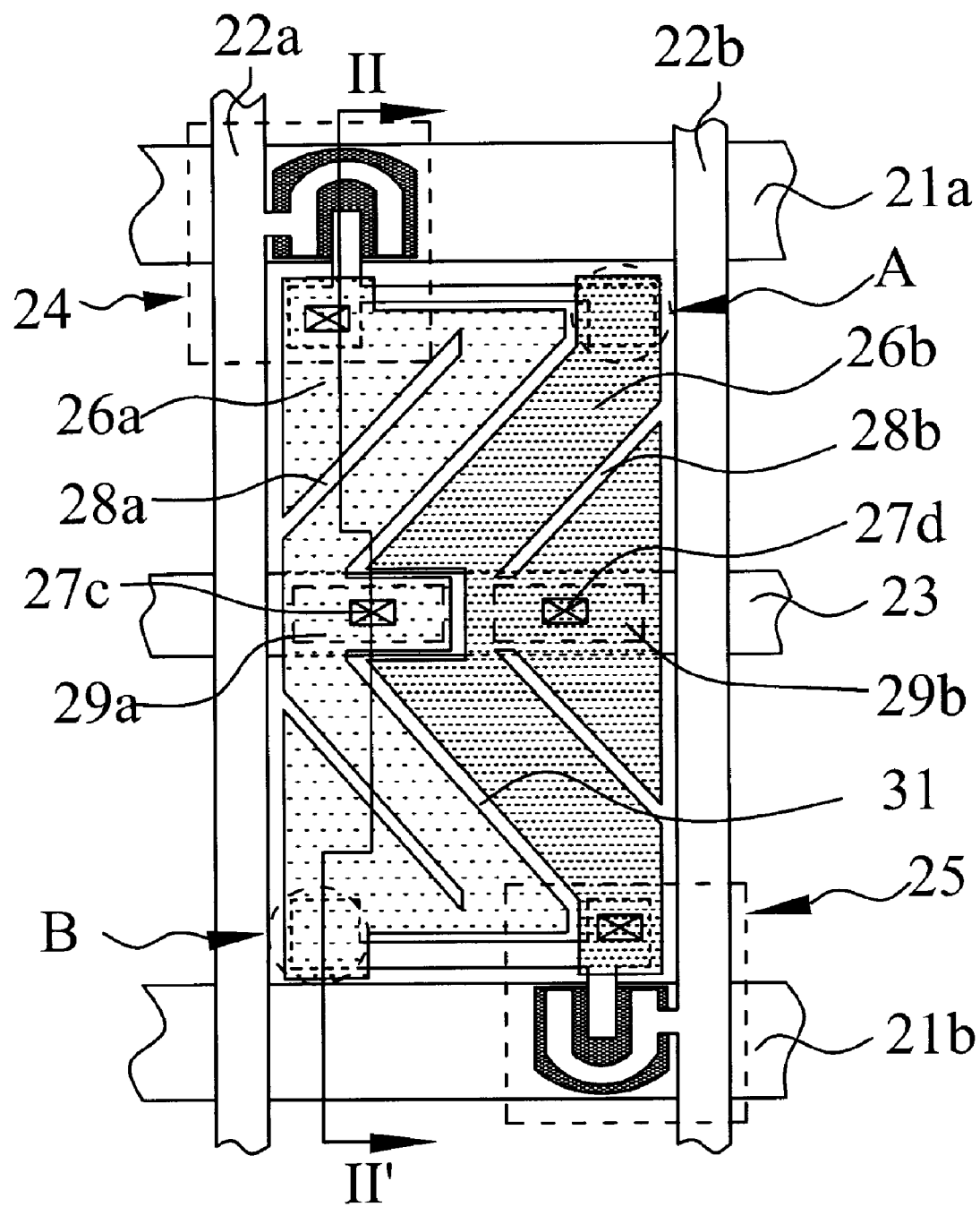
FIG. 3 is a schematic view showing a pixel structure according to an embodiment of the invention.

FIG. 3 is a schematic view showing a pixel structure on an array substrate of LCD according to an embodiment of the invention. The array substrate comprises a plurality of scan lines and data lines, such as scan lines 21a, 21b and data lines 22a, 22b illustratively shown in FIG. 3. The scan lines 21a, 21b and the data lines 22a, 22b are crosswise arranged (for example perpendicularly crossing) to define a pixel region on the array substrate. Each pixel is divided into a first sub-pixel in which a first sub-pixel electrode 26a is formed and a second sub-pixel in which a second sub-pixel electrode 26b is formed. The first sub-pixel electrode 26a and the second sub-pixel electrode 26b are electrically isolated by a slit 31. The first sub-pixel electrode 26a is provided with a plurality of openings 28a, and the second sub-pixel electrode 26b is provided with a plurality of openings 28b. The slit 31 and the openings 28a, 28b may be provided in a parallel manner. A storage capacitor electrode 23 forms a storage capacitor with a pixel electrode, and in particular, the storage capacitor electrode 23 forms a first sub-storage capacitor with the first sub-pixel electrode 26a, and forms a second sub-storage capacitor with the second sub-pixel electrode 26b. In an embodiment, in order to increase capacitance of the storage capacitor, an auxiliary metal layer 29a may be provided between the storage capacitor electrode 23 and the first sub-pixel electrode 26a, and an auxiliary metal layer 29b may be provided between the storage capacitor electrode 23 and the second sub-pixel electrode 26b. The auxiliary metal layers 29a and 29b are electrically connected with the first and second sub-pixel electrode 26a and 26b via through holes 27c and 27d respectively (see FIG. 5). Storage capacitors are well known in the art in terms of function and operation, and will not be described in detail herein. In addition, a through hole 27a is indicated with diagonal crossing lines in the plan view of FIG. 3, and the structure thereof in a direction perpendicular to the surface of the array substrate can be better seen in FIG. 5. Other through holes indicated with diagonal crossing lines in other figures also have similar structures.

The first and second sub-pixel electrodes 26a and 26b are controlled by two switching elements, for example a first TFT 24 and a second TFT 25.

Figure 4A:
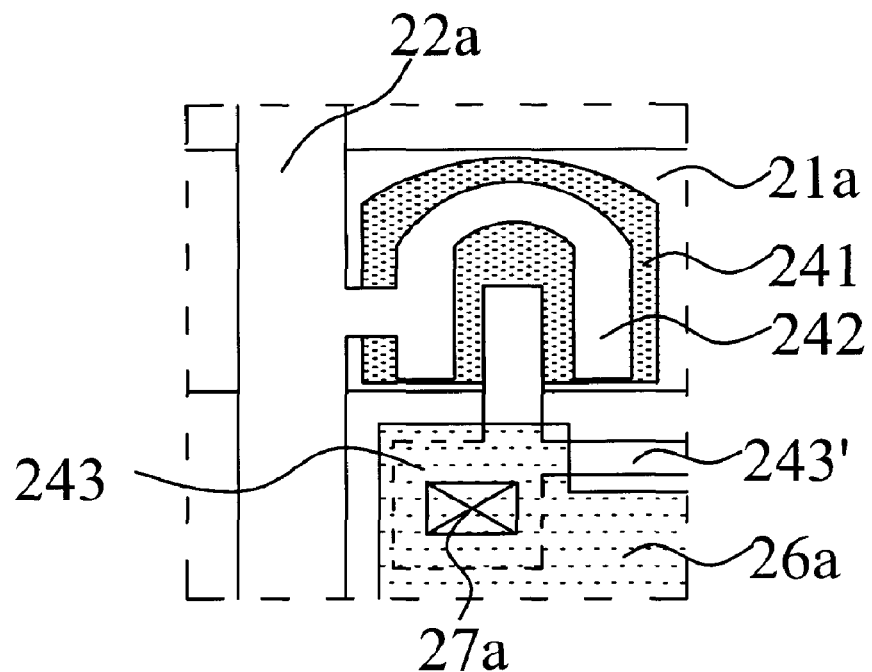
FIGS. 4A-B are respectively enlarged views of first and second TFTs in FIG. 3.

FIG. 4A is an enlarged view of the first TFT 24 in FIG. 3. As shown in FIG. 4A, the first TFT 24 comprises a gate electrode, a semiconductor layer 241, a source electrode 242 and a drain electrode 243. The gate electrode of the first TFT 24 is electrically connected with the scan line 21a, and in the particular embodiment is a part of the scan line 21a. The source electrode 242 is electrically connected with the data line 22a, and the drain electrode 243 is electrically connected with the first sub-pixel electrode 26a via the through hole 27a. The drain electrode 243 of the first TFT 24 has an extension 243' which extends to overlap the second sub-pixel electrode 26b in a region A as shown in FIG. 3.

Figure 4B:
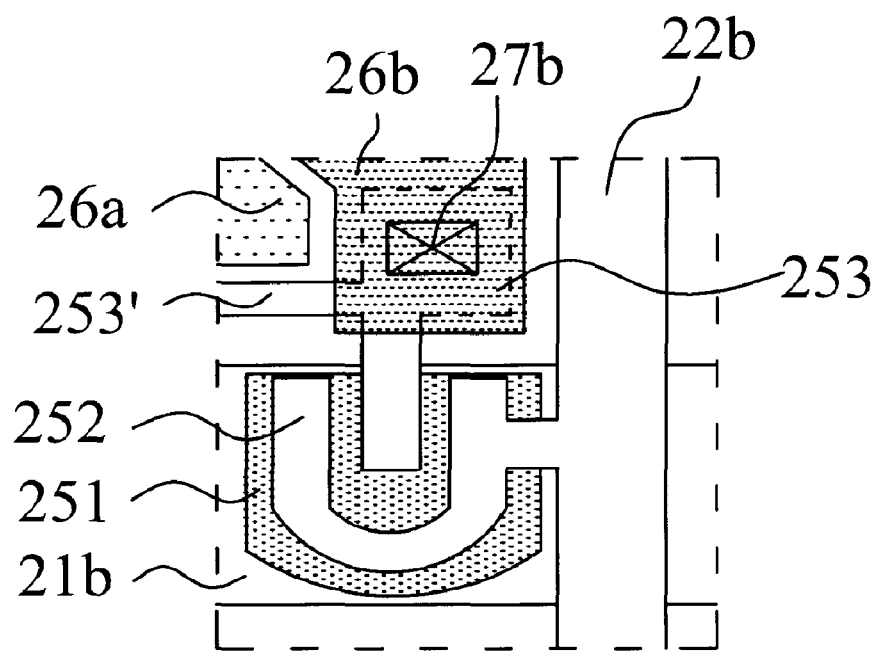

FIG. 4B is an enlarged view of the second TFT 25 in FIG. 3. As shown in FIG. 4B, the second TFT 25 comprises a gate electrode, a semiconductor layer 251, a source electrode 252 and a drain electrode 253. The gate electrode of the second TFT 25 is electrically connected with the scan line 21b, and in the particular embodiment is a part of the scan line 21b. The source electrode 252 is electrically connected with the data line 22b, and the drain electrode 253 is electrically connected with the second sub-pixel electrode 26b via the through hole 27b. The drain electrode 253 of the second TFT 25 has an extension 253' which extends to overlap the first sub-pixel electrode 26a in a region B as shown in FIG. 3.

In the embodiment, the gate electrodes of the first and second TFTs 24 and 25 are respectively a part of the scan lines 21a and 21b. That is, they are connected with different scan lines 21a and 21b. The source electrodes 242 and 252 of the first and second TFTs 24 and 25 are connected with different data lines 22a and 22b respectively. However, the gate electrodes of the first and second TFTs 24 and 25 may be connected with the same scan line, or, the source electrode of them may be connected with the same data line. For example, the second TFT 25 may be provided at the scan line 21a above the region A of FIG. 3. The second TFT 25 may also be provided below the region B of FIG. 3 so that the first and second TFTs 24 and 25 both have their source electrodes connected with the data line 22a.

Figure 5:
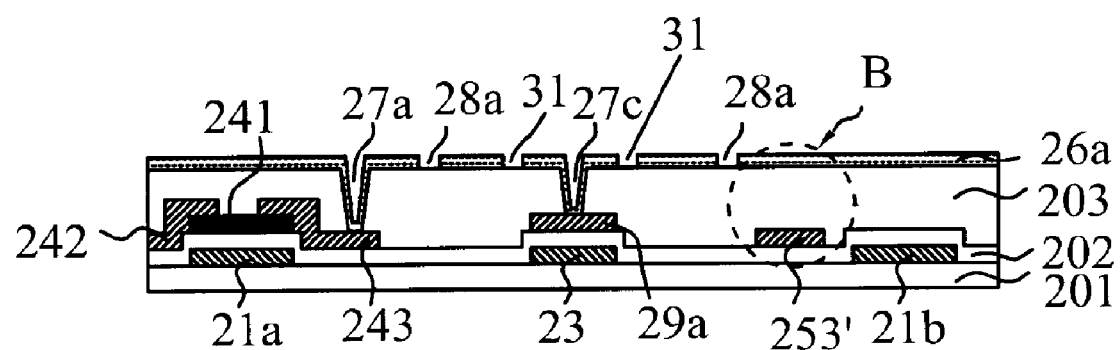
FIG. 5 is a section view taken along a line II-II' in FIG. 3.

FIG. 5 is a section view taken along a line II-II' in FIG. 3. As shown in FIG. 5, the scan lines 21a (gate electrode), 21b and the storage capacitor electrode 23 are provided on a glass substrate 201, and a gate insulating layer 202 covers the scan lines and the storage capacitor electrode. A semiconductor layer 241 is provided on the gate insulating layer 202. The source electrode 242 and drain electrode 243 of the first TFT 24 is provided on the semiconductor layer 241. The auxiliary metal layer 29a and the drain electrode extension 253' of the second TFT 25 are provided in the same layer as the source electrode 242 and the drain electrode 243. The passivation layer 203 covers the source electrode, the drain electrode and the auxiliary metal layer, and the first sub-pixel electrode 26a which is formed on the passivation layer is electrically connected with the drain electrode 243 and the auxiliary metal layer 29a via the through holes 27a and 27c. The first sub-pixel electrode 26a is formed with the opening 28a and the slit

31. As shown in FIG. 5, the storage capacitor electrode 23 forms a first storage capacitor with the auxiliary metal layer 29*a*, and the first sub-pixel electrode 26*a* overlaps with the drain electrode extension 253' of the second TFT 25 in the region B.

Figure 6:
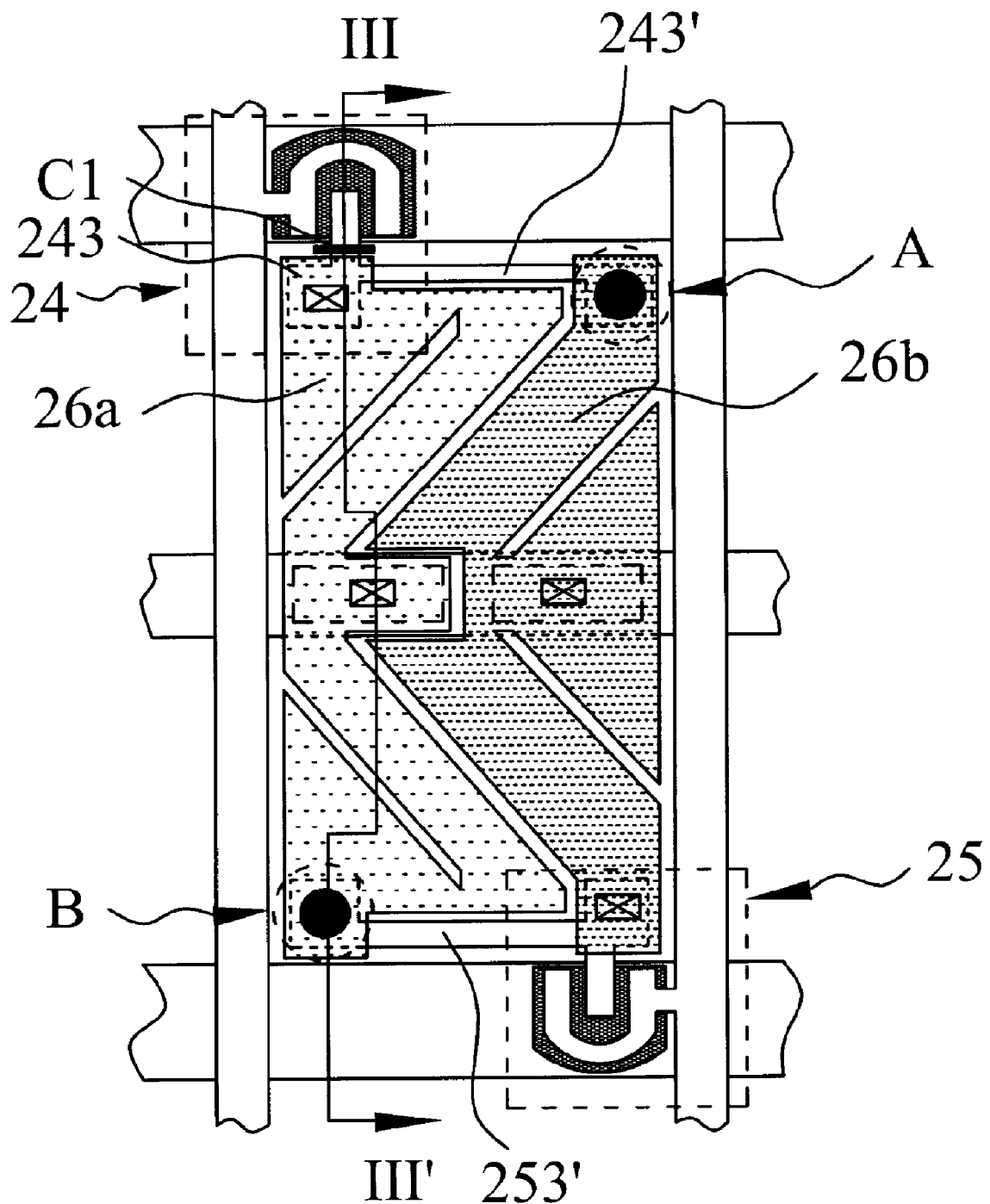
FIG. 6 shows a repair of a dot defect of a sub-pixel in the pixel structure according to an embodiment of the invention.

FIG. 6 shows a repair when a defect occurs in a sub-pixel of the pixel according to an embodiment, e.g., when a TFT cannot normally carry out control on a corresponding sub-pixel. For example, the first TFT 24 in the first sub-pixel fails due to shorting or the like and cannot normally control the first sub-pixel electrode 26*a*. The connection between the drain electrode of the first TFT 24 and the first sub-pixel electrode 26*a* is cut off at a position C1 where the drain electrode of the first TFT 24 does not overlap the semiconductor layer by laser for example, so that the drain electrode of the first TFT 24 is electrically isolated from the first sub-pixel electrode 26*a*. It is noted that after this laser cutting, the drain electrode of the first TFT 24 is divided into a first portion which lies over and overlaps the semiconductor layer, and a second portion which does not overlap the semiconductor layer and remains electrically connected with the first sub-pixel electrode 26*a* via the through hole 27*a* (more details can be found from the section view discussed further below in conjunction with FIG. 7). The second portion will not be referred to as "drain electrode" herein because it has been separated from the drain electrode of the TFT in effect. In addition, the drain electrode extension 243' of the first TFT 24 is electrically connected to the second sub-pixel electrode 26*b*, by laser melting for example, in the region A where the drain electrode extension 243' of the first TFT 24 overlaps the second sub-pixel electrode 26*b*. The drain electrode extension 253' of the second TFT 25 may be further connected to the first sub-pixel electrode 26*a*, by laser melting for example, in the region B where the drain electrode extension 253' of the second TFT 25 overlaps the first sub-pixel electrode 26*a*. These steps are not necessarily carried out in sequence. That is, the step of electrically isolating the drain electrode and the first TFT 26*a* may be carried out first, or the step of electrically connecting the drain electrode extension 243' of the first TFT 24 to the second sub-pixel electrode 26*b* and/or the step of electrically connecting the drain electrode extension 253' of the second TFT 25 to the first sub-pixel electrode 26*a* may be carried out first, or these steps may be carried out simultaneously.

Figure 7:
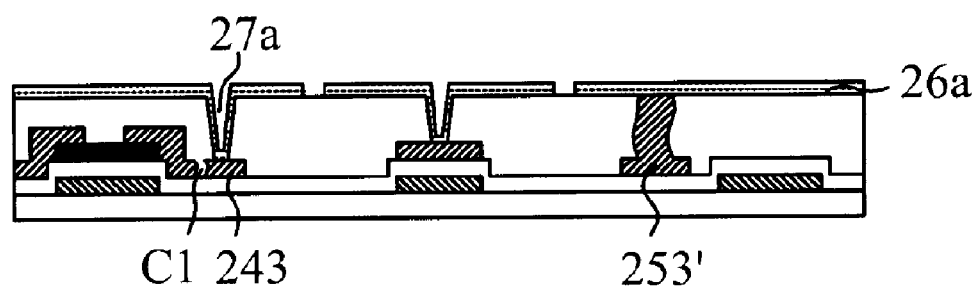
FIG. 7 is a section view taken along a line III-III' in FIG. 6.

FIG. 7 is a section view taken along a line III-III' in FIG. 6. In comparison with FIG. 5, the drain electrode extension 253' of the second TFT 25 is now electrically connected with the first sub-pixel electrode 26*a* after the repair, and the drain electrode of the first TFT 24 is cut off at the position C1 where it does not overlap the semiconductor layer.

With the repair carried out above, the first sub-pixel electrode 26*a* can be in an electrical connection with the second sub-pixel electrode 26*b* by way of the drain electrode extension 243' of the first TFT 24 and the drain electrode extension 253' of the second TFT 25 so that the second TFT 25 can, in place of the first TFT 24, control the first sub-pixel electrode 26*a*. The first sub-pixel will have the same display as the second sub-pixel. As a result, the dot defect in the first sub-pixel is repaired and the whole pixel can be normally displayed.

In the embodiment, the drain electrode extensions 243' and/or 253' serve as a connection element, and when the control of the first sub-pixel electrode 26*a* by the first TFT 24 cannot be normally carried out due to a failure in the first TFT 24, the drain electrode 253 of the second TFT 25 is electrically connected with the first sub-pixel electrode 26*a* by way of the drain electrode extension 253' and the second sub-pixel electrode 26*b* is electrically connected with the first sub-pixel electrode 26*a* by way of the drain electrode extension 243'. As is apparent to those of ordinary skill in the art, the defective sub-pixel can be repaired as long as one of the first and second TFTs 24, 25 is provided with a drain electrode extension 243' or 253' such that the drain electrode extension 243' or 253' of the one of the first and second TFTs 24, 25 is electrically connected with the sub-pixel electrode corresponding to the other TFT in the region A or B. Nonetheless, it is advantageous to carry out repair in both regions A and B as in the embodiment so as to achieve a higher likelihood of repair.

When the second TFT 25 in the second sub-pixel fails due to shorting or the like and cannot normally carry out control on the second sub-pixel electrode 26*b*, a repair can be carried out similar to the above. When carrying out the repair, the connection between the drain electrode of the second TFT 25 and the second sub-pixel electrode 26*b* is cut off such that the drain electrode is electrically isolated from the second sub-pixel electrode 26*b*. Moreover, the drain electrode extension 243' of the first TFT 24 is electrically connected with the second sub-pixel electrode 26*b* and/or the drain electrode extension 253' of the second TFT 25 is electrically connected with the first sub-pixel electrode 26*a*.

Figure 8:
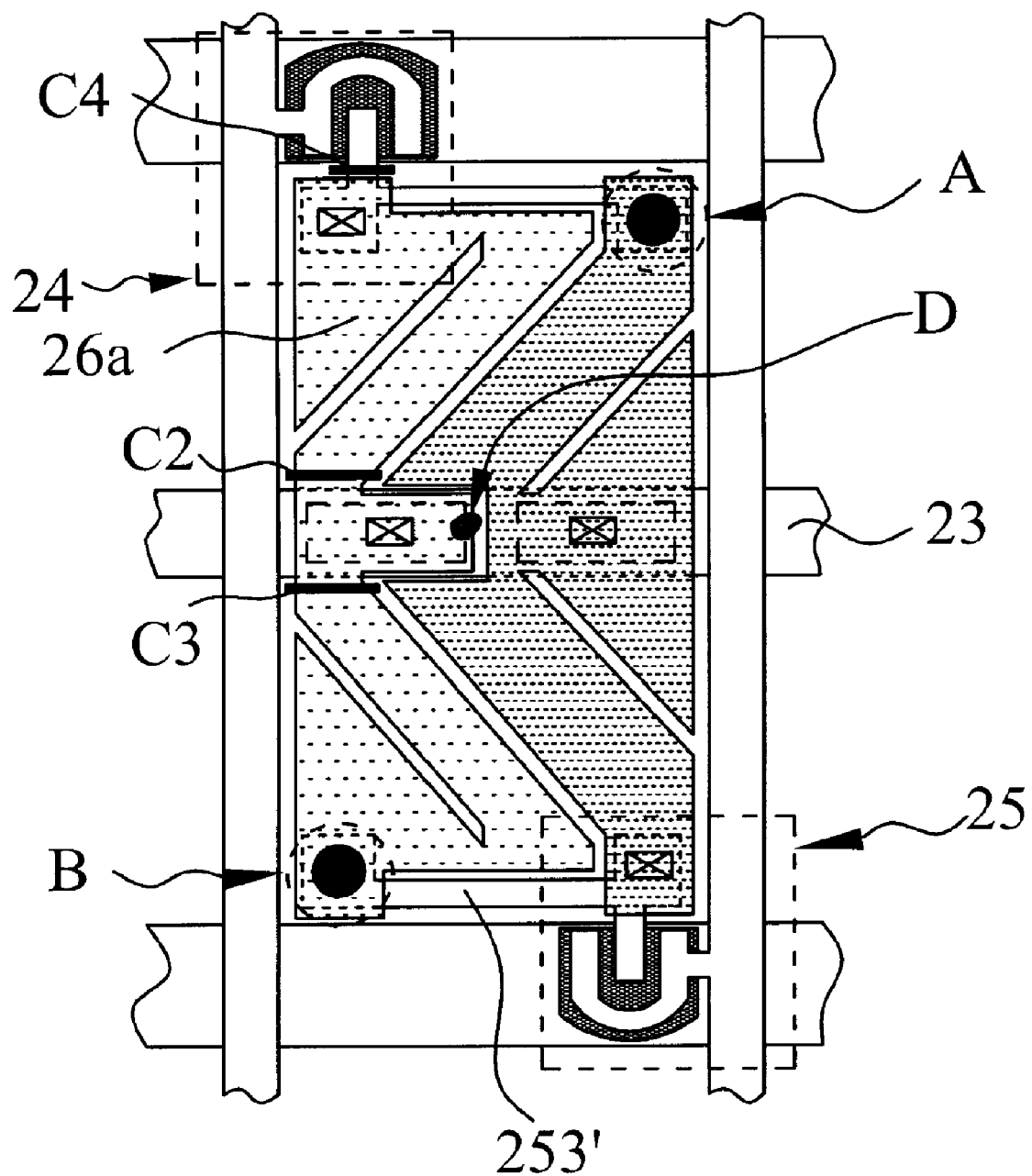
FIG. 8 shows another illustrative scheme to repair a dot defect of a sub-pixel in the pixel structure according to the embodiment of the invention.

FIG. 8 shows another repair of a dot defect of a sub-pixel in the pixel according to an embodiment of the invention. As shown in FIG. 8, when a shorting defect between the first sub-pixel electrode 26*a* and the storage capacitor electrode 23 occurs at a position D, and the first TFT 24 cannot control the first sub-pixel electrode 26*a* normally, repair can be carried out as follows. By laser, for example, the first sub-pixel electrode 26*a* is cut off at positions C2 and C3 on both sides of the storage capacitor electrode such that in the first sub-pixel electrode 26*a*, the portion (the "first portion") that is shorted with the storage capacitor electrode 23 is electrically isolated from other portions (the "second portion"). The connection between the drain electrode of the first TFT 24 and the first sub-pixel electrode 26*a* is cut off, by laser, for example, at a position C4 where the drain electrode of the first TFT 24 does not overlap the semiconductor layer such that the drain electrode is electrically isolated from the first sub-pixel electrode 26*a*. The drain electrode extension 243' of the first TFT 24 is electrically connected with the second sub-pixel electrode 26*b* in the region A where it overlaps the second sub-pixel electrode 26*b* by laser, for example. The drain electrode extension 253' of the second TFT 25 is electrically connected with the first sub-pixel electrode 26*a* in the region B where it overlaps the first sub-pixel electrode 26*a* by, for example, laser melting. In this manner, the second TFT 25 can, in place of the first TFT 24, control a portion above the position C2 and a portion below the position C3 in the first sub-pixel electrode 26*a*. As a result, the dot defect is repaired.

In the illustrative embodiment above, the drain electrode extension 243' of the first TFT 24 extends to overlap the second sub-pixel electrode 26*b* with the insulative passivation layer 203 in between, and the drain electrode extension 253' of the second TFT 25 extends to overlap the first sub-pixel electrode 26*a* with the passivation layer 203 in between. In this case, the drain electrode extension 243' can be electrically connected to the second sub-pixel electrode 26*b* simply by laser melting in a position of the region A, and the drain electrode extension 253' can be electrically connected to the first sub-pixel electrode 26*a* simply by laser melting in a position of the region B, resulting in a convenient repair.

Embodiments of the invention can also work with additionally provided connection elements, without the drain electrode extension 243' of the first TFT 24 and/or the drain electrode extension 253' of the second TFT 25 extending to overlap the second and/or first sub-pixel electrodes 26b/26a. Some exemplary embodiments will be described below.

Figure 9:
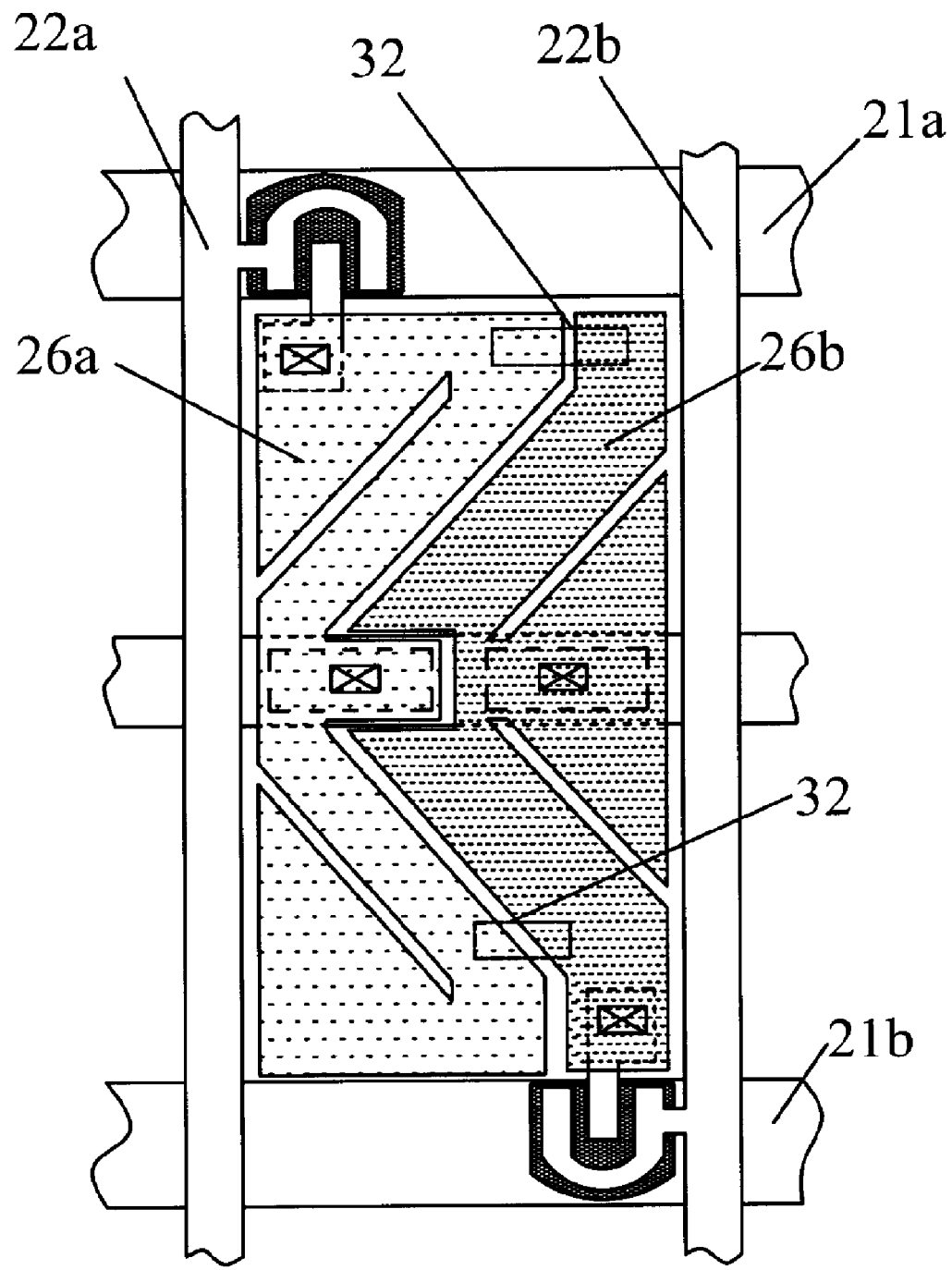
FIG. 9 shows a pixel structure according to another embodiment of the invention.

As an example, in an embodiment shown in the plan view of FIG. 9, a separate conductive connection element 32 is provided. In a section view like FIG. 5, the conductive connection element 32 may be positioned in the same layer (also referred to as a "first metal layer") as the scan lines 21a, 21b (the gate electrode), or in the same layer (also referred to as a "second metal layer") as the source electrode 242 and the drain electrode 243. The first sub-pixel electrode 26a overlaps a portion of the conductive connection element 32 with an insulating layer in between, and the second sub-pixel electrode 26b overlaps another portion of the conductive connection element 32 with an insulating layer in between. In repair, by laser melting for example, the first and second sub-pixel electrodes 26a and 26b are made electrically connected to these two portions of the conductive connection element 32 respectively such that the first and second sub-pixel electrodes 26a and 26b are electrically connected in an indirect manner.

Figure 10:
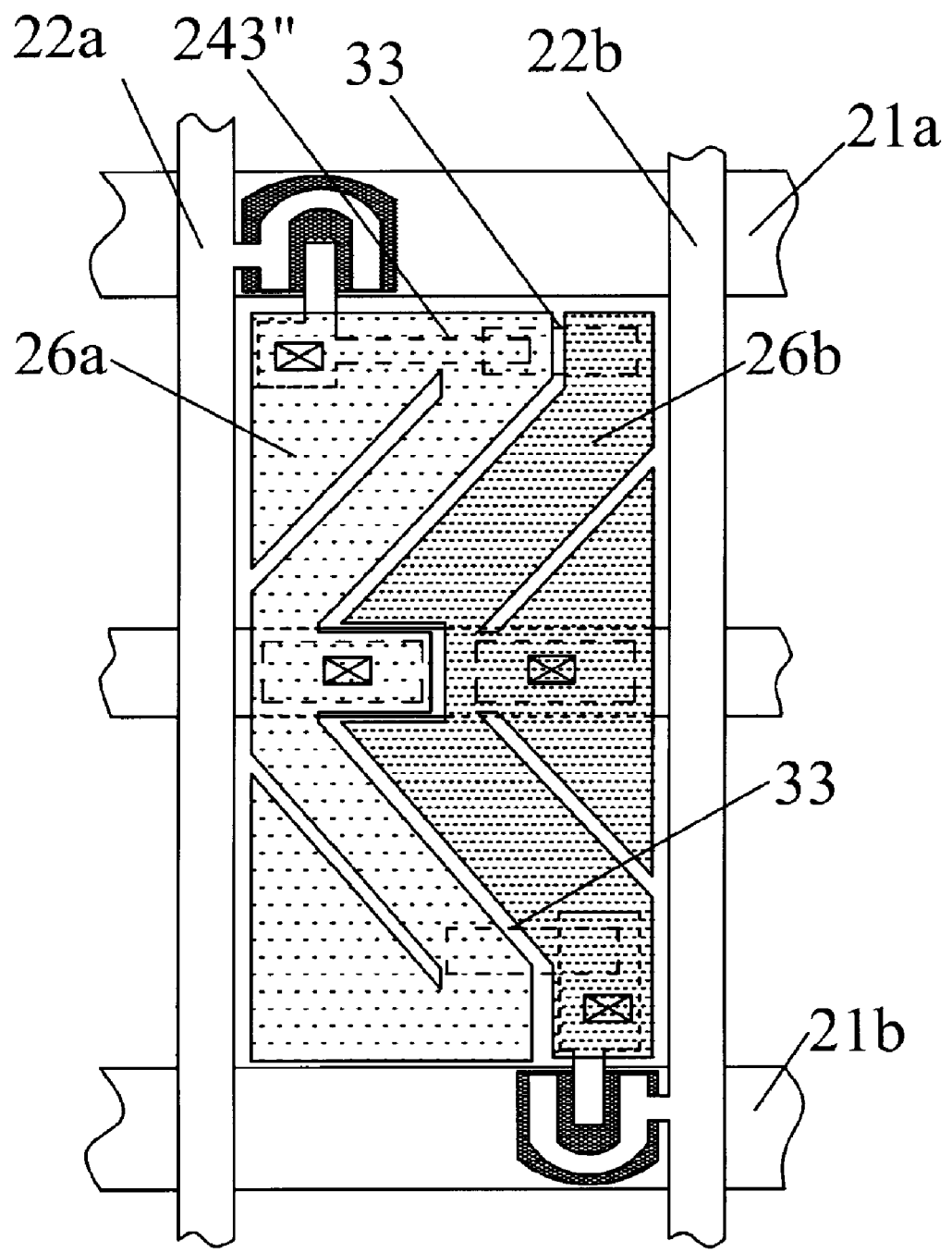
FIG. 10 shows a pixel structure according to another embodiment of the invention.

In an embodiment shown in FIG. 10, a conductive connection element 33 is provided such that a drain electrode extension 243" of the first TFT 24 extends to overlap a portion of the conductive connection element 33 with an insulating layer in between and the second sub-pixel electrode 26b overlaps another portion of the conductive connection element 33 with an insulating layer in between, but the drain electrode extension 243" itself does not overlap the second sub-pixel electrode 26b. In repair, the drain electrode extension 243" of the first TFT 24 and the second sub-pixel electrode 26b are made electrically connected to the two portions of the conductive connection element 33, by laser melting for example, such that the first sub-pixel electrode 26a is electrically connected with the second sub-pixel electrode 26b by way of the drain electrode 243 of the first TFT 24, the drain electrode extension 243" and the conductive connection element 33.

Figure 11:
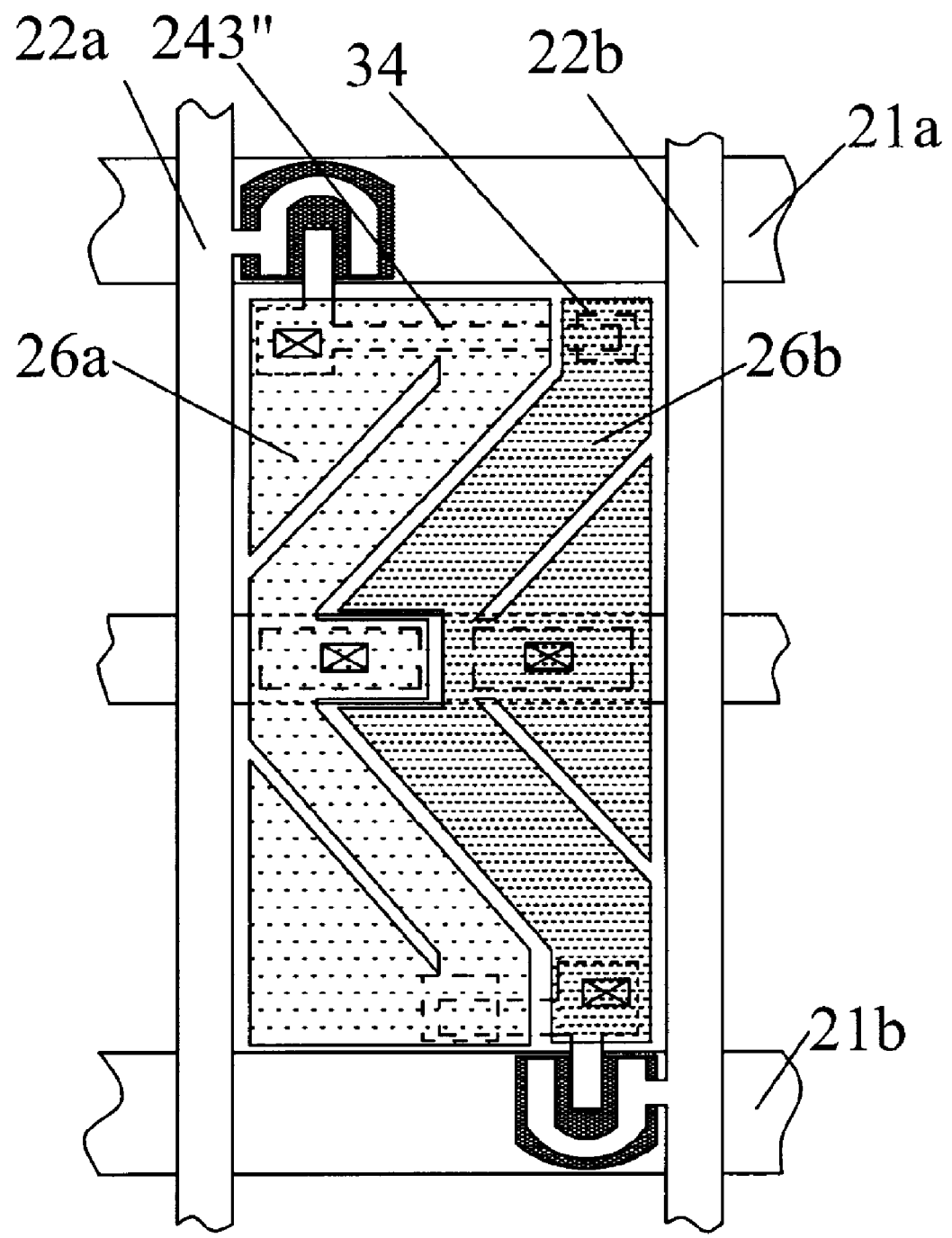
FIG. 11 shows a pixel structure according to another embodiment of the invention.

In an embodiment shown in FIG. 11, a conductive connection element 34 is provided such that a drain electrode extension 243" of the first TFT 24 extends to overlap a portion of the conductive connection element 34 with an insulating layer in between, and the second sub-pixel electrode 26b in another layer overlaps the same portion of the conductive connection element 34 with an insulating layer in between. In repair, both the drain electrode extension 243" of the first TFT 24 and the second sub-pixel electrode 26b are made electrically connected with the conductive connection element 34 by laser melting for example, so that the first and second sub-pixel electrodes 26a and 26b are electrically connected.

Figure 12:
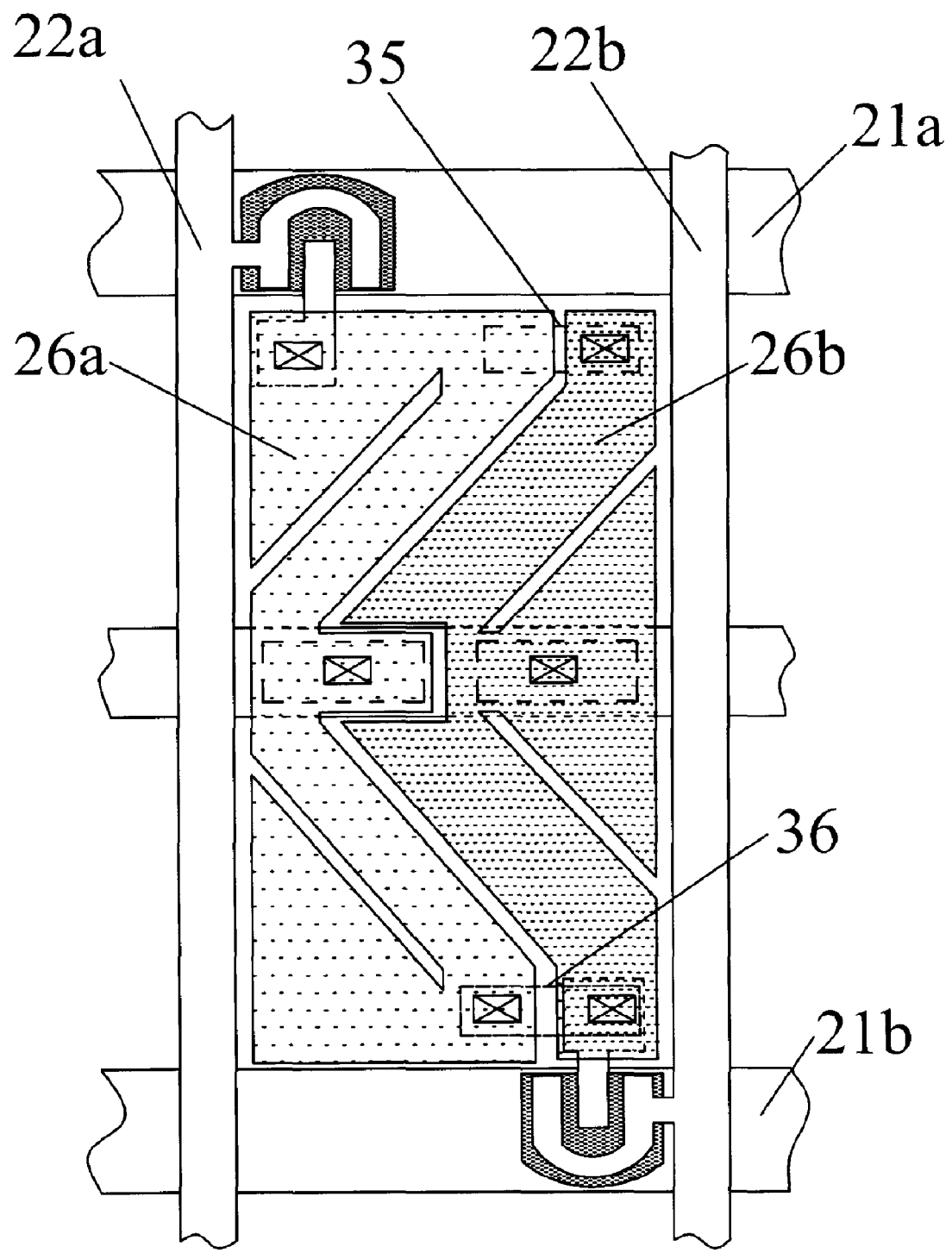
FIG. 12 shows a pixel structure according to another embodiment of the invention.

In an embodiment shown in FIG. 12, conductive connection elements 35 and 36 are provided. The conductive connection element 35 may be provided in either the first metal layer or the second metal layer. A portion of the conductive connection element 35 is electrically connected with the second sub-pixel electrode 26b via a through hole, and another portion of the conductive connection element 35 overlaps the first sub-pixel electrode 26a with an insulating layer in between. The conductive connection element 36 may be provided in the first metal layer. A portion of the conductive connection element 36 is electrically connected with the first sub-pixel electrode 26a via a through hole, and another portion of the conductive connection element 36 overlaps the drain electrode of the second TFT with an insulating layer in between. In repair, by laser melting for example, the first sub-pixel electrode 26a and the corresponding portion of the conductive connection element 35 are made electrically connected, and/or the drain electrode of the second TFT and the corresponding portion of the conductive connection portion 36 are made electrically connected such that the first and second sub-pixel electrodes 26a and 26b are electrically connected.

In the embodiments shown in FIGS. 9-12, the drain electrode extension 253' of the second TFT 25 and the first sub-pixel electrode 26a may also be configured such that the region B in FIG. 3 is configured similar to the region A in FIG. 3. In these structures, the second sub-pixel electrode 26b does not directly overlap the drain electrode extension 243' of the first TFT 24 to form a capacitor, and therefore a coupling effect therebetween can be reduced to improve the quality of display. The same applies to the first sub-pixel electrode 26a and the drain electrode extension 253' of the second TFT 25.

In addition, different connection manners in respective embodiments described above may be used in combination in one embodiment. The positions where the connection element is connected to the respective pixel electrodes can be selected as required, and are not limited to the regions A, B and the connection regions shown in FIGS. 9-12.

In the embodiments described above, the first and second TFTs 24 and 25 are described as an example for the switching elements for respectively controlling the first and second sub-pixel electrodes 26a and 26b. However, it is also conceivable for those of ordinary skill in the art to use other types of switching elements (especially semiconductor switching elements) instead of the first and second TFTs 24 and 25 to control the first and second sub-pixel electrodes 26a and 26b, and various connecting manners may be used for these switching elements depending on their operating principles and specific configurations. The invention can be carried out to achieve repair of a pixel as long as the second switching element can wholly or partially control the first sub-pixel electrode in place of the first switching element when the control of the first sub-pixel electrode by the first switching element cannot be carried out normally.

The MVA LCD is taken as an example in the description above. However, the invention is not limited to the MVA LCD, and is applicable as long as a plurality of sub-pixels exists in the pixel structure of the array substrate. Abundant details are set forth above for fully understanding of the invention. However, the invention may be carried out in various manners different from those described herein, and those of ordinary skill in the art may make similar extension without departure from the spirit of the invention. For example, one pixel electrode can be divided into more than two sub-pixel electrodes; the first and second sub-pixel electrodes are not limited to the specific details described and illustrated herein in terms of shape, size, relative position and the like; the storage capacitor electrode is not limited to the specific shape, position, size and orientation shown in the drawings; the structural arrangement of respective layers of the array substrate shown in FIGS. 5 and 7 may be modified as required by process or economy. Therefore, the invention is to be defined by the claims instead of limited by the detailed embodiments.

What is claimed is:

1. An array substrate for a liquid crystal display, comprising a plurality of scan lines, a plurality of data lines and a plurality of pixels defined by a crosswise arrangement of the scan lines and the data lines, the pixel comprising:
   a first sub-pixel electrode;
   a second sub-pixel electrode electrically isolated from the first sub-pixel electrode;
   a first switching element for controlling the first sub-pixel electrode; and a second switching element for controlling the second sub-pixel electrode, wherein when the control of the first sub-pixel electrode by the first switching element cannot be carried out normally, the second switching element can control at least a part of the first sub-pixel electrode in place of the first switching element.

2. The array substrate according to claim 1, wherein the first switching element comprises a first thin film transistor having a drain electrode electrically connected with the first sub-pixel electrode;

the second switching element comprises a second thin film transistor having a drain electrode electrically connected with the second sub-pixel electrode;

the pixel comprises a connection element; and when the control of the first sub-pixel electrode by the first thin film transistor cannot be carried out normally, the drain electrode of the second thin film transistor and/or the second sub-pixel electrode is electrically connected with at least a part of the first sub-pixel electrode by way of the connection element.

3. The array substrate according to claim 2, wherein the connection element comprises a first extension extending from the drain electrode of the first thin film transistor, the first extension overlapping the second sub-pixel electrode with an insulating layer in between.

4. The array substrate according to claim 2, wherein the connection element comprises a second extension extending from the drain electrode of the second thin film transistor, the second extension overlapping the first sub-pixel electrode with an insulating layer in between.

5. The array substrate according to claim 2, wherein the connection element is made of a conductor, and the connection element, the first sub-pixel electrode and the second sub-pixel electrode overlap mutually with insulating layers in between.

6. The array substrate according to claim 2, wherein the connection element is made of a conductor, the drain electrode of the first thin film transistor overlaps a portion of the connection element with an insulating layer in between, and the second sub-pixel electrode overlaps another portion of the connection element with an insulating layer in between.

7. The array substrate according to claim 2, wherein the connection element is made of a conductor, a portion of the connection element overlaps the first sub-pixel electrode with an insulating layer in between, and another portion of the connection element is electrically connected with the second sub-pixel electrode via a through hole.

8. The array substrate according to claim 2, wherein the first thin film transistor and the second thin film transistor have respective gate electrodes connected with the different scan lines.

9. The array substrate according to claim 8, wherein the first thin film transistor and the second thin film transistor have respective source electrodes connected with the different data lines.

10. The array substrate according to claim 9, wherein at least one of the first and second sub-pixel electrodes have a plurality of protrusions or openings formed thereon.

11. A liquid crystal display comprising an array substrate, the array substrate comprising a plurality of scan lines, a plurality of data lines and a plurality of pixels defined by a crosswise arrangement of the scan lines and the data lines, the pixel comprising:

a first sub-pixel electrode;

a second sub-pixel electrode electrically isolated from the first sub-pixel electrode;

a first switching element for controlling the first sub-pixel electrode; and a second switching element for controlling the second sub-pixel electrode, wherein when the control of the first sub-pixel electrode by the first switching element cannot be carried out normally, the second switching element can control at least a part of the first sub-pixel electrode in place of the first switching element.

12. The liquid crystal display according to claim 11, wherein the first switching element comprises a first thin film transistor having a drain electrode electrically connected with the first sub-pixel electrode;

the second switching element comprises a second thin film transistor having a drain electrode electrically connected with the second sub-pixel electrode;

the pixel comprises a connection element; and when the control of the first sub-pixel electrode by the first thin film transistor cannot be carried out normally, the drain electrode of the second thin film transistor and/or the second sub-pixel electrode is electrically connected with at least a part of the first sub-pixel electrode by way of the connection element.

13. The liquid crystal display according to claim 12, wherein the connection element comprises a first extension extending from the drain electrode of the first thin film transistor, the first extension overlapping the second sub-pixel electrode with an insulating layer in between.

14. The liquid crystal display according to claim 12, wherein the connection element comprises a second extension extending from the drain electrode of the second thin film transistor, the second extension overlapping the first sub-pixel electrode with an insulating layer in between.

15. The liquid crystal display according to claim 12, wherein the connection element is made of a conductor, and the connection element, the first sub-pixel electrode and the second sub-pixel electrode overlap mutually with insulating layers in between.

16. The liquid crystal display according to claim 12, wherein the connection element is made of a conductor, the drain electrode of the first thin film transistor overlaps a portion of the connection element with an insulating layer in between, and the second sub-pixel electrode overlaps another portion of the connection element with an insulating layer in between.

17. The liquid crystal display according to claim 12, wherein the connection element is made of a conductor, a portion of the connection element overlaps the first sub-pixel electrode with an insulating layer in between, and another portion of the connection element is electrically connected with the second sub-pixel electrode via a through hole.

* * * * *